US012676185B2

(12) United States Patent
Bansal et al.

(10) Patent No.: US 12,676,185 B2
(45) Date of Patent: Jul. 7, 2026

(54) ENERGY EFFICIENT COMPUTE-IN-MEMORY SRAM-C CIRCUIT ARCHITECTURE

(71) Applicants:NORTHROP GRUMMAN SYSTEMS CORPORATION, Falls Church, VA (US); The Regents of the University of California, Oakland, CA (US)

(72) Inventors: Shashank Bansal, La Jolla, CA (US); Bouchaib Cherif, Somers, NY (US); Gert Cauwenberghs, San Diego, CA (US); Gopabandhu Hota, Palo Alto, CA (US); Soumil Jain, Redwood City, CA (US)

(73) Assignees: NORTHROP GRUMMAN SYSTEMS CORPORATION, Falls Church, VA (US); THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 149 days.

(21) Appl. No.: 18/883,400

(22) Filed: Sep. 12, 2024

(65) Prior Publication Data

US 2026/0073977 A1     Mar. 12, 2026

(51) Int. Cl.
*G11C 11/00*       (2006.01)
*G06F 7/50*        (2006.01)
(Continued)

(52) U.S. Cl.
CPC .............. *G11C 11/412* (2013.01); *G06F 7/50* (2013.01); *G06F 7/523* (2013.01); *G11C 11/418* (2013.01); *G11C 11/419* (2013.01)

(58) Field of Classification Search
CPC ... G11C 11/412; G11C 11/418; G11C 11/419; G06F 7/50; G06F 7/523
(Continued)

(56) References Cited

U.S. PATENT DOCUMENTS 5,058,072 A     10/1991  Kashimura
8,817,520 B2 *  8/2014   Khanna ................. G11C 11/221
                                              365/207
(Continued)

OTHER PUBLICATIONS

C3SRAM: An In-Memory-Computing SRAM Macro Based on Robust Capacitive Coupling Computing Mechanism, IEEE Journal of Solid-State Circuits, vol. 55, No. 7, Jul. 2020.
(Continued)

*Primary Examiner* — Tha-O H Bui
(74) *Attorney, Agent, or Firm* — KATTEN MUCHIN ROSENMAN LLP

(57)        ABSTRACT
The capacitively-coupled static random access memory (SRAM-C) compute-in-memory (CIM) circuit includes at least one static random access memory (SRAM) configured to store a bit value, at least one capacitively-coupled (CC) circuit coupled to at least one SRAM, and an energy recovery logic (ERL) driver configured to recover signal energy by utilizing a ramped sinusoidal hot clock. The CC circuit includes a first and second capacitors, a first pair, a second pair, a third pair, a fourth pair of transistors. Each pair of transistors include a first and second transistors coupled to one another. the first capacitor is coupled to the first and second pairs of transistors and the second capacitor is coupled to the third and fourth pairs of transistors. The SRAM-C CIM circuit enhances efficiency and effectiveness of multiply-and-accumulate (MAC) operations of the SRAM-C CIM circuit.

18 Claims, 6 Drawing Sheets

(51) Int. Cl.
    *G06F 7/523*        (2006.01)
    *G11C 11/412*      (2006.01)
    *G11C 11/418*      (2006.01)
    *G11C 11/419*      (2006.01)

(58) Field of Classification Search
    USPC ........................................................ 365/156
    See application file for complete search history.

(56)               References Cited

U.S. PATENT DOCUMENTS

| | | | |
|---|---|---|---|
| 11,669,446 B2 * | 6/2023 | Verma ................. | G06N 3/0495 |
| | | | 711/157 |
| 11,714,570 B2 | 8/2023 | Chang et al. | |
| 11,714,749 B2 | 8/2023 | Lee et al. | |
| 11,762,700 B2 * | 9/2023 | Zhang ...................... | G06F 7/50 |
| | | | 712/220 |
| 11,783,875 B2 | 10/2023 | Seok et al. | |
| 11,948,659 B2 * | 4/2024 | Yang ..................... | G06F 7/5443 |
| 12,487,795 B2 * | 12/2025 | Yang ..................... | G06F 7/5443 |
| 12,488,228 B2 * | 12/2025 | Seo ........................ | G06N 3/063 |
| 2022/0230679 A1 | 7/2022 | Mirhaj et al. | |

OTHER PUBLICATIONS

International Search Report and Written Opinion mailed Jan. 8, 2026, from International Patent Application No. PCT/US2025/044995, 11 sheets.

\* cited by examiner

ENERGY EFFICIENT COMPUTE-IN-MEMORY SRAM-C CIRCUIT ARCHITECTURE

This invention was made with government support under Government Contract No. FA8650-23-C-7306 awarded by Defense Advanced Research Projects Agency (DARPA). The government has certain rights in the invention.

BACKGROUND

Traditional capacitively-coupled static random access memory (SRAM) compute-in-memory (CIM) circuits have several limitations that should be addressed. These limitations include energy inefficiency, noise issues, and SWaP (size, weight, and power) issues. Traditional capacitively-coupled SRAM CIM circuits often require active switching of capacitors, which can lead to unnecessary energy consumptions. There are needs for a more energy-efficient approach, especially in applications where power conservation is crucial. The traditional capacitively-coupled SRAM CIM circuits also have kT/C sampling noise issues. The kT/C noise is the thermal noise power added to a signal when a sample is taken on a capacitor in mixed-signal circuit designs. The kT/C sampling noise is a significant problem in conventional capacitively-coupled SRAM CIM circuits. This noise can interfere with circuit's performance, especially in precision applications. Reducing or eliminating this noise is vital for improving reliability and accuracy of the capacitively-coupled SRAM CIM circuits. The use of larger capacitors, often necessary in traditional reliability and accuracy SRAM CIM circuit designs to counteract noise and other issues, results in larger physical footprint. This is a substantial drawback in applications where space is limited. Along with size, power consumption is also a critical factor, particularly in portable or low power devices. Traditional capacitively-coupled SRAM CIM circuits, in which capacitor size and switching mechanism are not optimized, can consume more power than desired.

SUMMARY

In order to overcome the issues of the conventional capacitively-coupled SRAM CIM circuits, the discloses invention proposes adiabatic charge redistribution with capacitively-coupled SRAM CIM circuits that significantly improve the energy-efficiency and linearity of multiply-and-accumulate (MAC) operations.

The capacitively-coupled static random access memory (SRAM-C) compute-in-memory (CIM) circuit of the disclosed invention enhances the efficiency and effectiveness of analog MAC operations. By employing passive charge redistribution in the "compute" operations and introducing a novel energy recycling method, where differential row parallel inputs are adiabatically modulated through a sinusoidal hot clock using energy recovery logic drivers, this design eliminates the need for switching between SRAM-C CIM array and successive-approximation-register (SAR) analog-to-digital converter (ADC), which is a significant advancement in preserving charge and energy. This innovation is crucial in minimizing kT/C sampling noise in MAC readout, a common issue in CIM architectures. As a result, this allows to significantly reduce the unit capacitor, optimizing the design for minimal area and power consumption. Overall, the disclosed invention aims to achieve superior performance in SRAM-C CIM circuits with increased power and space efficiency.

These advantages and others are achieved, for example, by a capacitively-coupled static random access memory (SRAM-C) compute-in-memory (CIM) circuit that includes at least one static random access memory (SRAM) configured to store a bit value, at least one capacitively-coupled (CC) circuit connected to at least one SRAM, and an energy recovery logic (ERL) driver configured to recover signal energy by utilizing a ramped sinusoidal hot clock for charging/discharging of the CC circuit during a compute mode and for holding a voltage of the CC circuit during an idle mode. The CC circuit includes a first pair of transistors, a second pair of transistors, a third pair of transistors, a fourth pair of transistors, a first capacitor, and a second capacitor. Each pair of transistors include a first transistor and a second transistor connected to one another. The first capacitor is connected to the first and second pairs of transistors and the second capacitor is connected to the third and fourth pairs of transistors. The ERL driver supplies adiabatic voltage signals to either the first and third pair of transistors or the second and fourth pair of transistors depending on the weight signal.

The first transistor may be a p-channel metal-oxide semiconductor (PMOS) transistor, and the second transistor may be an n-channel metal-oxide semiconductor (NMOS) transistor. A source of the first transistor of said each pair of transistors may be connected to a source of the second transistor of said each pair of transistors, and a drain of the first transistor of said each pair of transistors may be connected to a drain of the second transistor of said each pair of transistors.

The SRAM may include a first transistor, a second transistor, a third transistor, a fourth transistor, a fifth transistor, and a sixth transistor. The first and second transistors are a first type transistors and the third, fourth, fifth, and sixth transistors are a second type transistors. Gates of the first and third transistors, drains of the second and fourth transistors, and a source of the sixth transistor are connected to each other. Gates of the second and fourth transistors, drains of the first and third transistors, and a source of the fifth transistor are connected to each other. A drain of the fifth transistor is connected to a complementary bit line to receive a complementary bit line signal. A drain of the sixth transistor is connected to a bit line to receive a bit line signal. Gates of the fifth and sixth transistors are connected to a word line to receive a word line signal for read/write operations of the SRAM. The gates of the second and fourth transistors of the SRAM may be connected to the first and third pairs of transistors of the CC circuit.

The SRAM-C CIM circuit may include a bit line driver for supplying the bit line signal and the complementary bit line signal to the SRAM. The SRAM-C CIM circuit may include a word line driver for supplying the word line signal to the SRAM.

The ERL driver may include a first transistor, a second transistor, a third transistor, and a fourth transistor. A source of the first transistor and a drain of the second transistor are connected to a hot clock to receive a clock signal. A drain of the first transistor and a source of the second transistor are connected to each other and supply adiabatic voltage signals to the first and fourth pair of transistors of the CC circuit. A drain of the third transistor is connected to the drain of the first transistor and the source of the second transistor. A source of the fourth transistor is connected to the drain of the first transistor and the source of the second transistor.

BRIEF DESCRIPTION OF THE DRAWINGS

The preferred embodiments described herein and illustrated by the drawings hereinafter are included to illustrate and not to limit the invention, where like designations denote like elements.

DETAILED DESCRIPTION

Figure 1A:
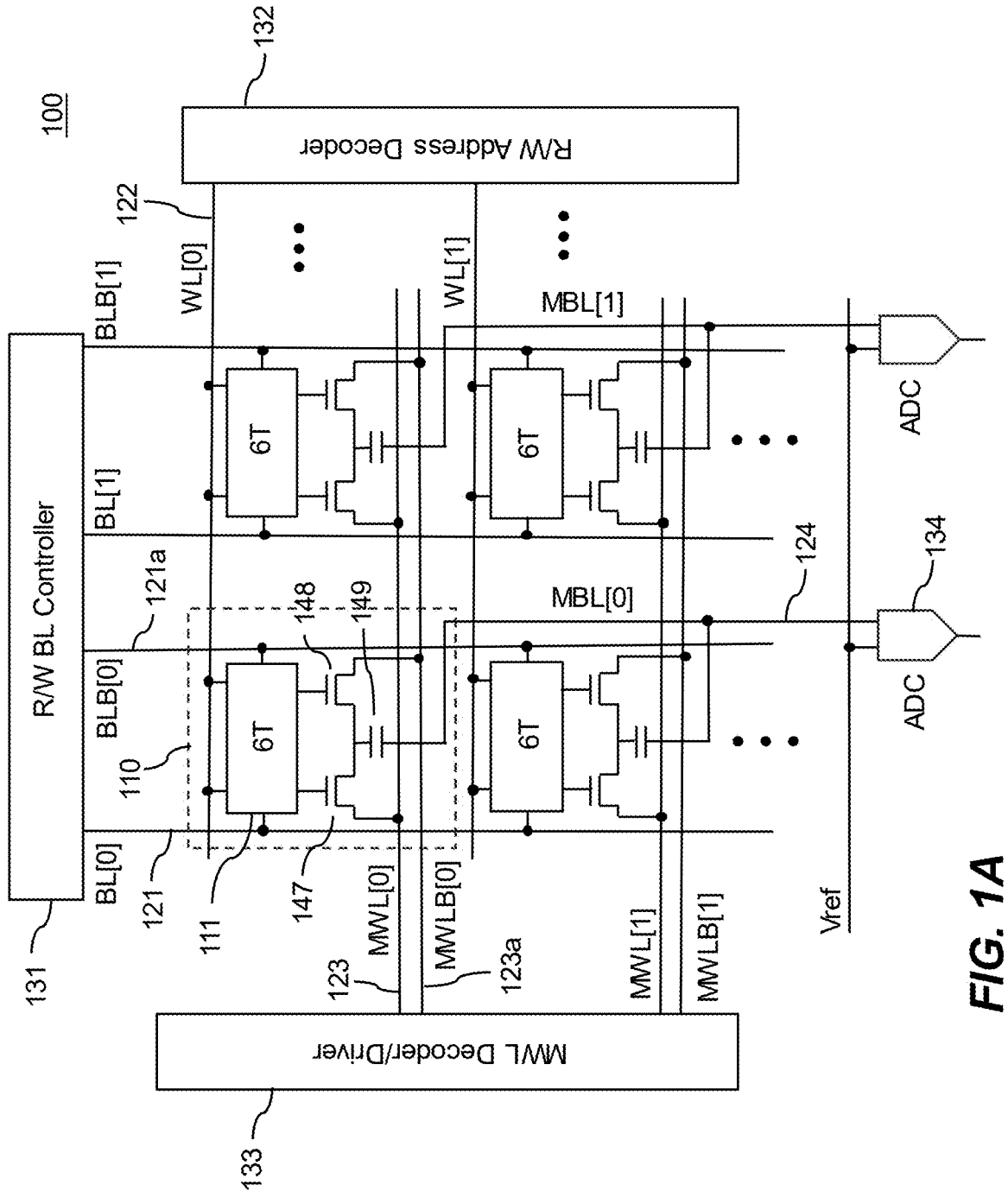
FIGS. 1A-1B illustrate an exemplary conventional capacitive-coupling computing SRAM circuit and a unit cell of the capacitive-coupling computing SRAM circuit shown in FIG. 1A, respectively.

The following detailed description is merely exemplary in nature and is not intended to limit the described embodiments or the application and uses of the described embodiments. All of the implementations described below are exemplary implementations provided to enable persons skilled in the art to make or use the embodiments of the disclosure and are not intended to limit the scope of the disclosure, which is defined by the claims. It is also to be understood that the drawings included herewith only provide diagrammatic representations of the presently preferred structures of the present invention and that structures falling within the scope of the present invention may include structures different than those shown in the drawings.

Figure 1B:
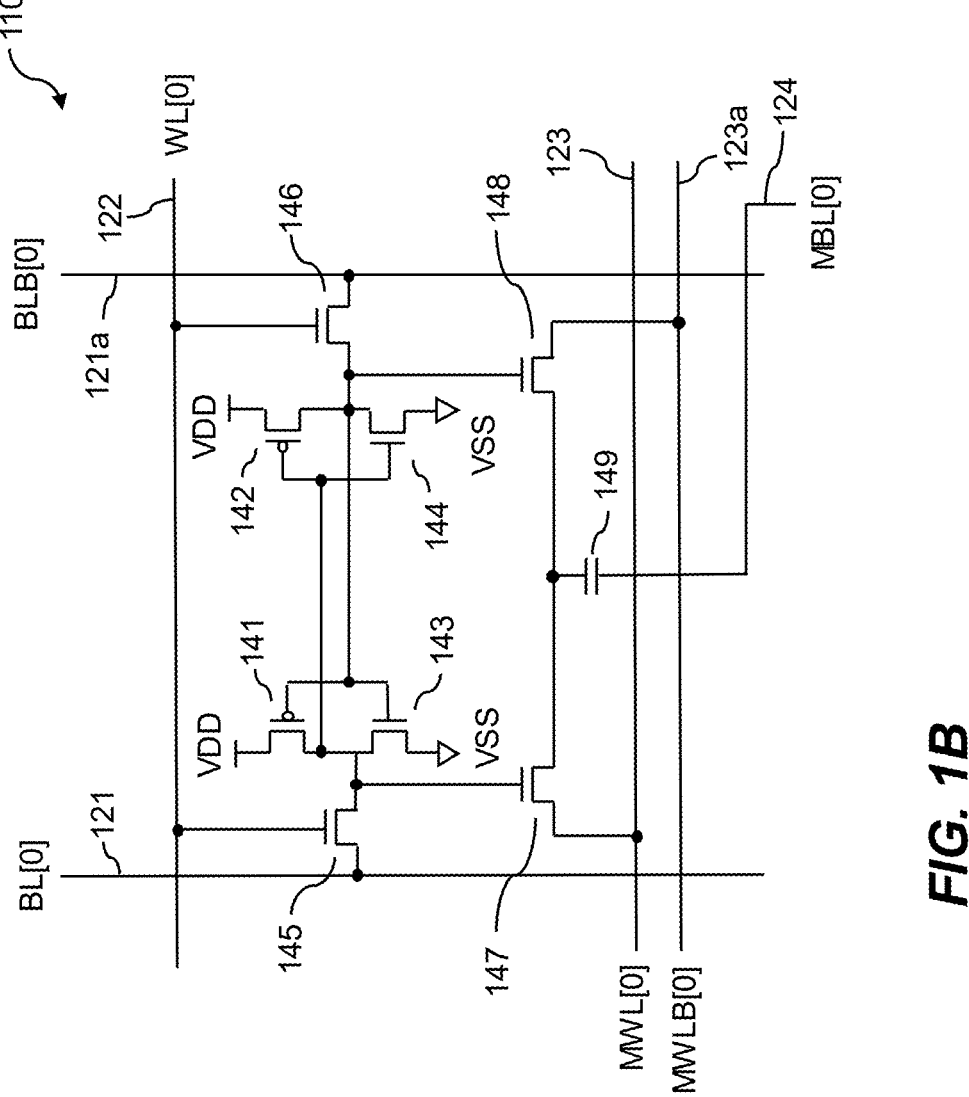

With reference to FIGS. 1A-1B, shown are exemplary conventional capacitive-coupling computing SRAM circuit 100 and unit cell 110 of the capacitive-coupling computing SRAM circuit 100 shown in FIG. 1A, respectively. The capacitive-coupling computing SRAM 100 includes a plurality of unit cells 110 that are arranged in an array. Each unit cell 110 is connected to a bit line controller 131 through bit lines BL, BLB 121, 121a, is connected to an address decoder 132 through word line WL 122, and is connected to multiply-and-accumulate (MAC) word line decoder/driver 133 through MAC word lines MWL, MWLB 123, 123a. The unit cell 110 includes a typical 6T SRAM cell 111, two pass or transmission transistors 147 and 148, and a capacitor 149.

As shown in FIG. 1B, the 6T SRAM cell 111 includes two (2) p-channel metal-oxide semiconductor (PMOS) transistors 141-142 and four (4) n-channel metal-oxide semiconductor (NMOS) transistors 143-146. The pass transistors 147-148 may be NMOS transistors. The pass transistors 147-148 are connected to the capacitor 149. In order to perform binary dot product, the capacitor 149 is charged/discharged by MAC word lines MWL, MWLB 123, 123a via the pass transistors 147, 148. The capacitor 149 is also connected to an analog-to-digital converter (ADC) 134 through a MAC bit line MBL 124. The capacitors 149 are included in the unit cells 110 to perform the compute-in-memory (CIM) operations. However, the introduction of the capacitor 149 into the unit cell 110 increases the overall power consumption and area overhead.

The disclosed invention proposes a capacitively-coupled static random-access memory (SRAM-C) compute-in-memory (CIM) circuit to solve the issues of the conventional capacitive-coupling computing SRAM, enhancing energy efficiency and effectiveness of analog MAC operations. The SRAM-C CIM circuit design of the disclosed invention leverages the principles of passive charge redistribution within a capacitively coupled framework. This architecture leads to inherent conservation of charge and energy. This design choice is pivotal in eliminating kT/C sampling noise, a common limitation in conventional capacitor-coupling SRAM circuits. Consequently, the SRAM-C CIM circuit design of the disclosed invention allows reduced size of unit capacitors. This is a critical feature, as smaller capacitors not only reduce the overall physical footprint of capacitive-coupling SRAM circuits but also minimize power consumption. The architecture's ability to operate efficiently with these smaller capacitors provides distinct features over conventional designs that often require larger capacitors to mitigate sampling noise and energy inefficiencies. Overall, the architecture of the disclosed invention represents a significant advancement in capacitive-coupling SRAM CIM circuit designs, prioritizing energy conservation, noise reduction and miniaturization without compromising on performance and reliability.

Figure 2:
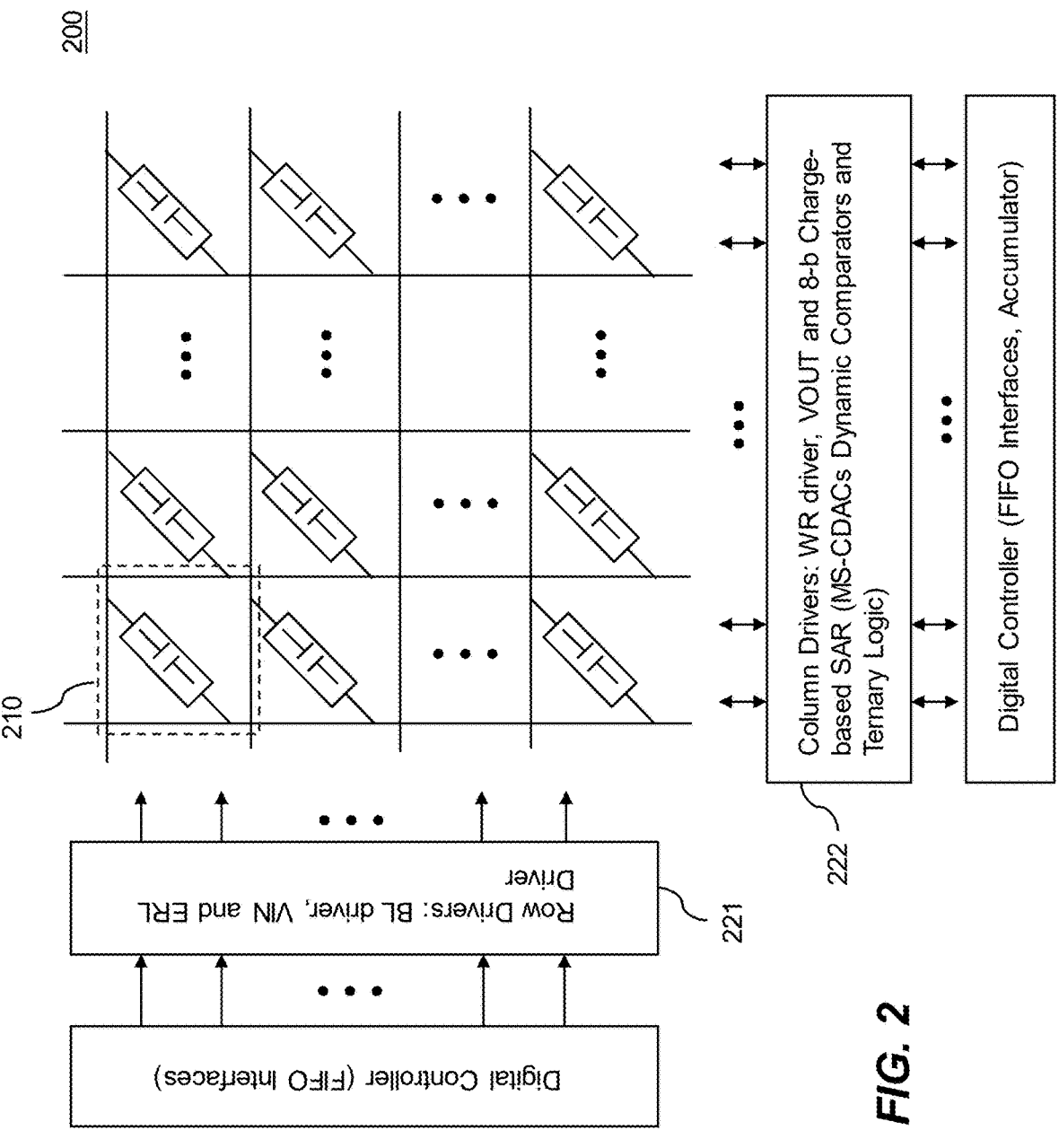
FIG. 2 illustrates a diagram of the capacitively-coupled static random access memory (SRAM-C) compute-in-memory (CIM) circuit of the disclosed invention.

With reference to FIG. 2, shown is a diagram of the capacitively-coupled static random access memory (SRAM-C) compute-in-memory (CIM) circuit 200 of the disclosed invention. The SRAM-C CIM circuit 200 includes a plurality of SRAM-C CIM unit cells 210, row drivers 221, which may include a bit line driver and an energy recovery logic (ERL) driver, and column drivers 222, which may include a word line driver and successive-approximation-register (SAR).

Figure 3:
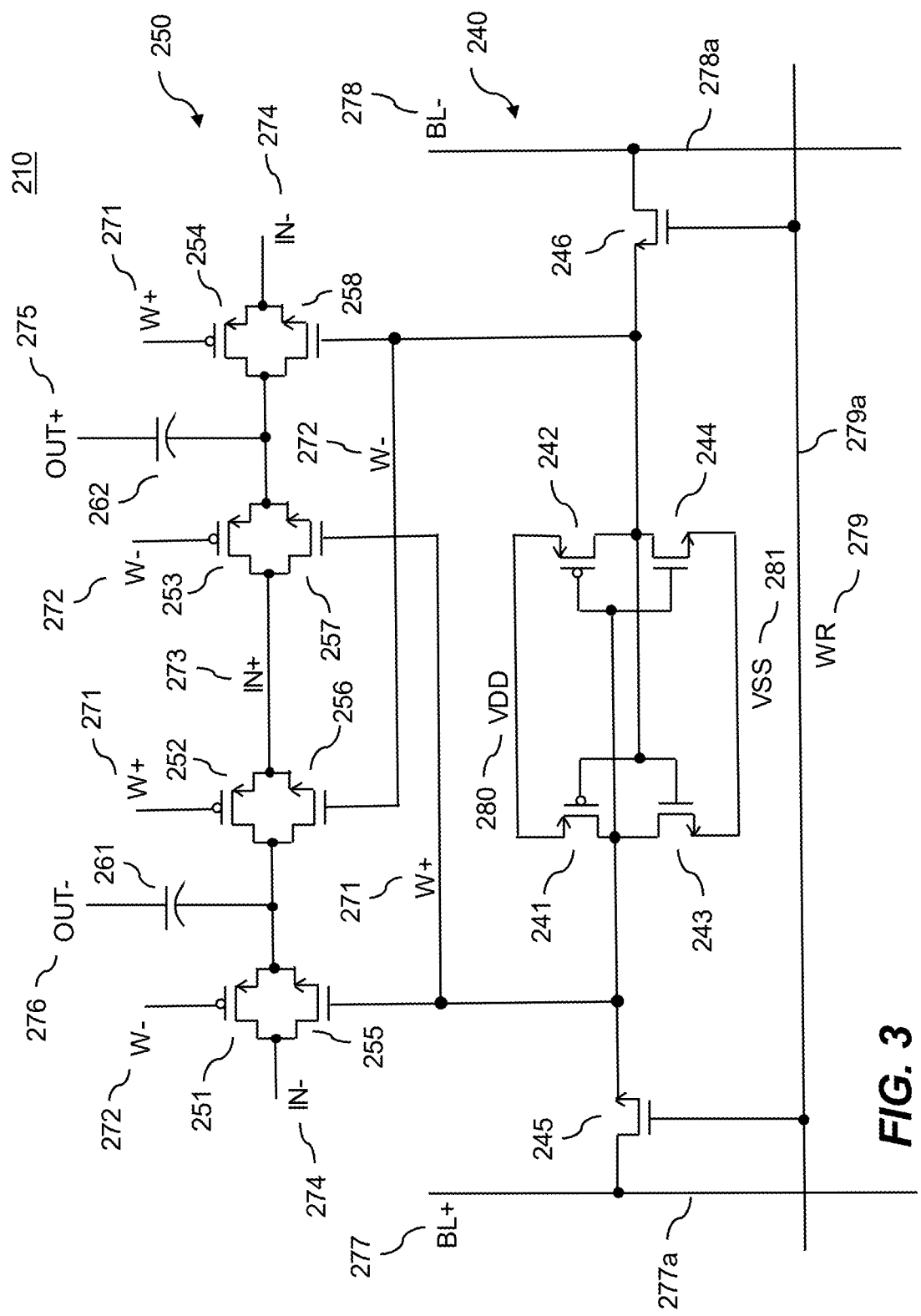
FIG. 3 illustrates a diagram of the SRAM-C CIM unit cell of the disclosed invention.

With reference to FIG. 3, shown is a diagram of the SRAM-C CIM unit cell 210 of the disclosed invention. The SRAM-C CIM unit cell 210 includes fourteen (14) transistors that may include eight (8) NMOS transistors and six (6) PMOS transistors. Specifically, the unit cell 210 includes a standard 6T SRAM cell 240 for local storage of complementary binary weights (weight_plus W+ 271 and weight_minus W− 272). The circuit performs a signed (−1, +1) binary-binary multiply-and-accumulate (MAC) operation between the stored weight 271, 272 and a column-parallel complementary input (IN_plus IN+ 273 and IN_minus IN− 274) that is differentially capacitively coupled onto two row parallel summing output nodes (OUT_plus OUT+ 275 and OUT_minus OUT− 276). The result for a row of these unit cells 210 is a fully parallel inner-product (massively parallel cross-correlation) between a stored template vector and a presented input vector, yielding an analog output that is linearly proportional to the degree of correlation between the two vectors, which is an essential operation for efficient implementation of pattern matching in hyper-dimensional computing.

Differing from the other or conventional capacitive-coupling SRAM approaches, the SRAM-C CIM circuit 200 of the disclosed invention achieves superior efficiency through a unique feature: the complementary column parallel inputs (IN+ 273 and IN− 274) are supplied adiabatically via a hot clock 400 (see FIG. 4), connected through the energy recovery logic (ERL) driver 300. This ensures a stable voltage drop across each active element in the SRAM-C CIM unit cell 210 at all times, effectively leading to an asymptotically zero computational energy.

Referring to FIG. 3, the SRAM-C CIM unit cell 210 includes SRAM 240, which is configured to store a bit value, and capacitively-coupled (CC) circuit 250 coupled to the SRAM 240. The SRAM 240 includes a first transistor 241, a second transistor 242, a third transistor 243, a fourth transistor 244, a fifth transistor 245, and a sixth transistor 246. In the exemplary embodiment shown in FIG. 3, the first and second transistors 241-242 may be PMOS transistors and the third, fourth, fifth, and sixth transistors 243-246 may be NMOS transistors. The PMOS transistor may be referred to as a first type transistor and the NMOS transistor may be referred to as a second type transistor, or vice-versa. In the descriptions, "coupled" means that elements are capable of being electrically connected.

Gates of the first and third transistors 241, 243, drains of the second and fourth transistors 242, 244, and a source of the sixth transistor 246 are connected to each other. Gates of the second and fourth transistors 242, 244, drains of the first and third transistors 241, 243, and a source of the fifth transistor 245 are connected to each other. The drain of the sixth transistor 246 is connected to a bit line 278a to receive a bit line signal BL− 278. The gate of the sixth transistor 246 is connected to a word line 279a to receive a word line signal WR 279 for read/write operations of the SRAM 240. The drain of the fifth transistor 245 is connected to a complementary bit line 277a to receive a complementary bit line signal BL+ 277. The gate of the fifth transistor 245 is connected to the word line 279a to receive the word line signal WR 279 for read/write operations of the SRAM 240. Sources of the first and second transistors 241, 242 are supplied with supply voltage VDD 280, and the sources of the third and fourth transistors 243, 244 are connected to ground or a reference voltage source VSS 281.

The SRAM-C CIM circuit 200 of the disclosed invention further includes a bit line driver (not shown), which may be integrated in the row driver 221, for supplying the bit line signals BL− BL+ 277, 278 to the SRAM 240, and further includes a word line driver (not shown), which may be integrated in the column driver 222, for supplying the word line signal WR 279 to the SRAM 240.

The capacitively-coupled (CC) circuit 250 includes a first transistor 251, a second transistor 252, a third transistor 253, and a fourth transistor 254, which may be PMOS transistors, and a fifth transistor 255, a sixth transistor 256, a seventh transistor 257, and an eighth transistor 258, which may be NMOS transistors. The source of the first transistor 251 is connected to the source of the fifth transistor 255, the source of the second transistor 252 is connected to the source of the sixth transistor 256, the source of the third transistor 253 is connected to the source of the seventh transistor 257, and the source of the fourth transistor 254 is connected to the source of the eighth transistor 258. The drain of the first transistor 251 is connected to the drain of the fifth transistor 255, the drain of the second transistor 252 is connected to the drain of the sixth transistor 256, the drain of the third transistor 253 is connected to the drain of the seventh transistor 257, and the drain of the fourth transistor 254 is connected to the drain of the eighth transistor 258.

The capacitively-coupled (CC) circuit 250 further includes a first capacitor 261 and a second capacitor 262. One terminal of the first capacitor 261 is connected to the sources of the first and fifth transistors 251, 255 and is connected to the drains of the second and sixth transistors 252, 256. Another terminal of the first capacitor 261 is connected to the output node OUT− 276. One terminal of the second capacitor 262 is connected to the sources of the third and seventh transistors 253, 257 and is connected to the drains of the fourth and eighth transistors 254, 258. Another terminal of the second capacitor 262 is connected to the output node OUT+ 275.

The CC circuit 250 is coupled to the SRAM 240 to perform MAC operations. As shown in FIG. 3, gates of the fifth and seventh transistors 255, 257 of the CC circuit 250 are connected to the gates of the second and fourth transistors 242, 244 of the SRAM 240, the drains of the first and third transistors 241, 243 of the SRAM 240, and the source of the fifth transistor 245 of the SRAM 240 to supply binary weight W+ 271 to the SRAM 240. Gates of the sixth and eighth transistors 256, 258 of the CC circuit 250 are connected to the gates of the first and third transistors 241, 243 of the SRAM 240, the drains of the second and fourth transistors 242, 244 of the SRAM 240, and the source of the sixth transistor 246 of the SRAM 240 to supply binary weight W− 272 to the SRAM 240.

The SRAM-C CIM unit cells 210 of the disclosed invention may be connected to a successive-approximation-register (SAR) analog-to-digital converter (ADC) (not shown), which may be integrated in the column driver 222, to perform MAC operations for the SRAM 240. The SRAM-C CIM supplies MAC operation signals to the first capacitor and the second capacitor. The output nodes OUT+ OUT− 275, 276 are connected to the first and second capacitor 261, 262 of the capacitively-coupled (CC) circuit 250.

Figure 4:
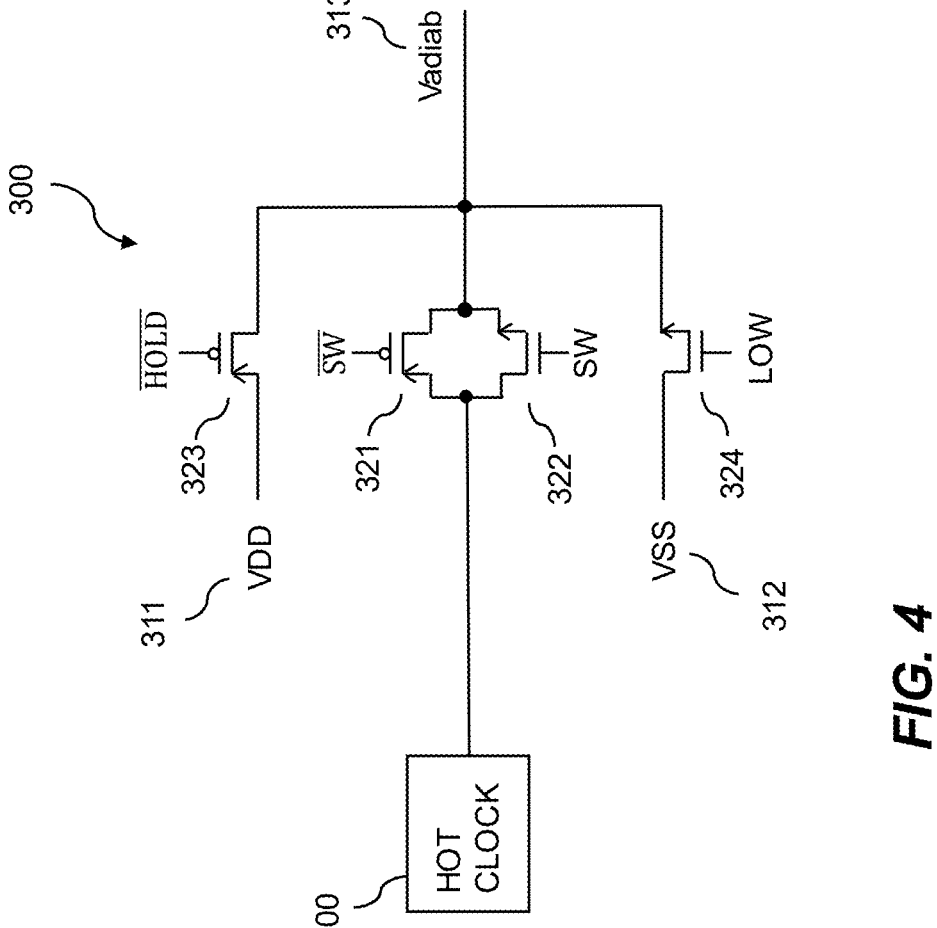
FIG. 4 illustrates a diagram of an energy recovery logic (ERL) driver coupled to a hot clock and is configured to recover signal energy for the SRAM-C CIM circuit.

With reference to FIG. 4, shown is a diagram of energy recovery logic (ERL) driver 300 coupled to hot clock 400. In the conventional capacitive coupling SRAM, each switching action results in the complete loss of energy associated with charging/discharging of capacitors. However, in the SRAM-C CIM circuit 200 of the disclosed invention, most of this energy loss can be recovered by using adiabatic charging principles. When a switching event occurs, the pull-up/pull-down network dissipates $\frac{1}{2}$ CV$^2$ energy. The ERL driver 300 circuit recovers signal energy by utilizing ramped sinusoidal from the hot clock 400 for charging/discharging of the CC circuit 250 during "compute" operation and holding voltage of the CC circuit 250 at VDD/VSS during "idle" operation.

Referring to FIG. 4, the ERL driver 300 includes a first transistor 321 and a second transistor 322, where the drain of the first transistor 321 is connected to the source of the second transistor 322, and the source of the first transistor 321 is connected to the drain of the second transistor 322. The source of the first transistor 321 and the drain of the second transistor 322 are connected to the hot clock 400 to receive clock signals. The ERL driver 300 further includes a third transistor 323 and a fourth transistor 324. The drain of the third transistor 322 and the source of the fourth transistor 324 are both connected to the drain of the first transistor 321 and the source of the second transistor 322, outputting adiabatic voltage signals 313 to the complementary column parallel inputs (IN+ 273 and IN− 274) of the capacitively-coupled (CC) circuit 250.

Figure 5:
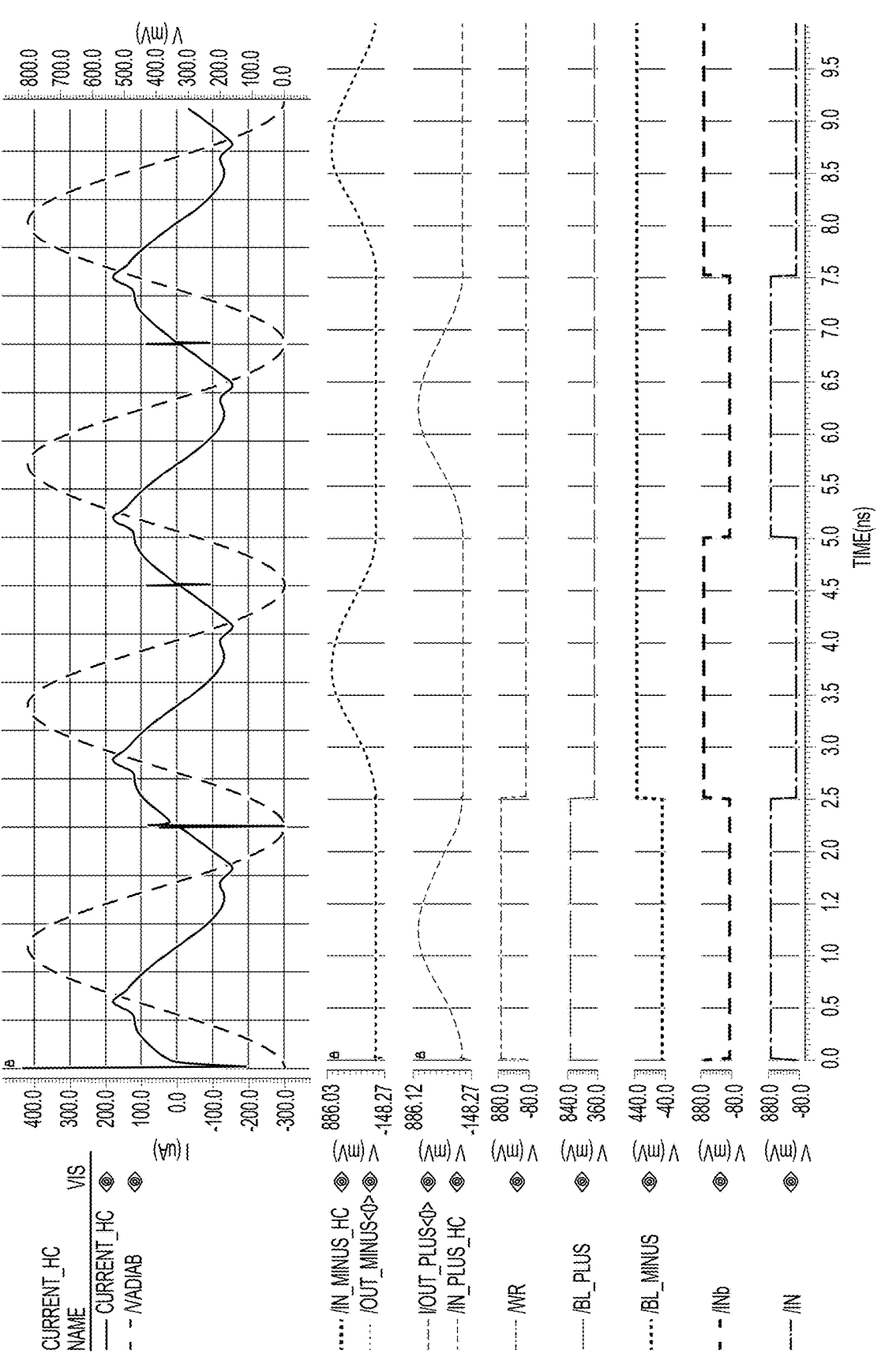
FIG. 5 illustrates test results of the efficiency of the SRAM-C CIM unit cell circuit that is driven adiabatically.

With reference to FIG. 5, shown is test results of the efficiency of the SRAM-C CIM unit cell 210 circuit that is driven adiabatically, with transistor-level simulations in 22 nm fully depleted silicon-on-insulator (FDSOI) complementary metal-oxide semiconductor (CMOS) technology. The results demonstrate that an energy consumption is less than 30 aJ (attojoule) for every MAC compute operation, a factor 30 times lower than any other MAC circuits, even in more advanced process nodes. The energy required for programming the SRAM-C CIM unit cell by activating write operation with a supplied template on the differential bit lines (BL_plus BL+ 275 and BL_minus BL− 276) is more than 400 aJ, that is more than 10 times higher than the compute energy. However, typically write operations are substantially less frequent than compute operations which dominate the overall energy footprint.

As described above, one of the main differences is that the disclosed invention avoids power hungry line drivers incurring a full loss of $CV^2$ energy for every computational cycle, by recycling the charge and the energy through ERL drivers adiabatically coupled to hot clock supplies. The SRAM-C CIM 200 of the disclosed invention also offers higher dynamic range in multiply and accumulate operations due to CMOS switches in the bit-cell, at zero-overhead of those extra transistors. By employing a charge-sharing mechanism between the SRAM-C CIM 200 and readout SAR ADC, we minimize the kT/C noise to boost linearity and accuracy in MAC operations.

The inventive concept of the circuit architectures of the SRAM-C CIM 200 lies in its novel approach to charge distribution and energy conservation. The key innovation is the use of passive charge redistribution, which is distinct from traditional capacitive-coupling SRAM circuit designs that rely on active switching of capacitors. This passive approach inherently conserves both charge and energy, representing a significant advancement in capacitive-coupling SRAM CIM technology.

By avoiding capacitor switching, the design not only conserves energy but also significantly reduces noise levels that is a common issue in capacitive-coupling SRAM CIM circuit. This reduction in noise is crucial because it enables the use of smaller capacitors, which was not feasible with traditional designs in which larger capacitors were needed to mitigate noise issues. The passive approach ensures that energy is not wasted in the process of switching, leading to a more efficient circuit operation. As result, the circuit can operate effectively with smaller capacitors, which minimizes its physical size and power requirements. This makes the circuit more efficient, compact, and suitable for application where SWaP (size, weight, and power) is critical considerations.

Since many modifications, variations, and changes in detail can be made to the described preferred embodiments of the invention, it is intended that all matters in the foregoing description and shown in the accompanying drawings be interpreted as illustrative and not in a limiting sense. Consequently, the scope of the invention should be determined by the appended claims and their legal equivalents.

What is claimed is:

1. A capacitively-coupled static random access memory (SRAM-C) compute-in-memory (CIM) circuit, comprising:
   at least one static random access memory (SRAM) configured to store a bit value; and
   at least one capacitively-coupled (CC) circuit connected to at least one SRAM, wherein the CC circuit comprises a first pair of transistors, a second pair of transistors, a third pair of transistors, a fourth pair of transistors, a first capacitor, and a second capacitor, wherein each pair of transistors comprise a first transistor and a second transistor connected to one another, and wherein the first capacitor is connected to the first and second pairs of transistors and the second capacitor is connected to the third and fourth pairs of transistors; and
   an energy recovery logic (ERL) driver configured to recover signal energy by utilizing a ramped sinusoidal hot clock for charging/discharging of the CC circuit during a compute mode and for holding a voltage of the CC circuit during an idle mode, wherein the ERL driver supplies adiabatic voltage signals to either the first and third pair of transistors or the second and fourth pair of transistors depending on a weight signal.

2. The SRAM-C CIM circuit of claim 1 wherein the first transistor is a p-channel metal-oxide semiconductor (PMOS) transistor, and the second transistor is an n-channel metal-oxide semiconductor (NMOS) transistor.

3. The SRAM-C CIM circuit of claim 1 wherein a source of the first transistor of said each pair of transistors is connected to a source of the second transistor of said each pair of transistors, and a drain of the first transistor of said each pair of transistors is connected to a drain of the second transistor of said each pair of transistors.

4. The SRAM-C CIM circuit of claim 1, wherein the at least one SRAM comprises:
   a first transistor, a second transistor, a third transistor, a fourth transistor, a fifth transistor, and a sixth transistor, wherein the first and second transistors are a first type transistors and the third, fourth, fifth, and sixth transistors are a second type transistors, wherein:
   gates of the first and third transistors, drains of the second and fourth transistors, and a source of the sixth transistor are connected to each other;
   gates of the second and fourth transistors, drains of the first and third transistors, and a source of the fifth transistor are connected to each other;
   a drain of the fifth transistor is connected to a complementary bit line to receive a complementary bit line signal;
   a drain of the sixth transistor is connected to a bit line to receive a bit line signal; and
   gates of the fifth and sixth transistors are connected to a word line to receive a word line signal for read/write operations of the SRAM.

5. The SRAM-C CIM circuit of claim 4, wherein the gates of the second and fourth transistors of the SRAM are connected to the first and third pairs of transistors of the CC circuit.

6. The SRAM-C CIM circuit of claim 4 further comprising a bit line driver for supplying the bit line signal and the complementary bit line signal to the SRAM.

7. The SRAM-C CIM circuit of claim 4 further comprising a word line driver for supplying the word line signal to the SRAM.

8. The SRAM-C CIM circuit of claim 1, further comprising a successive-approximation-register (SAR) analog-to-digital converter (ADC) to perform multiply-and-accumulate (MAC) operations for the SRAM.

9. The SRAM-C CIM circuit of claim 1, wherein the ERL driver comprises:
   a first transistor and a second transistor, wherein a source of the first transistor and a drain of the second transistor are connected to a hot clock to receive a clock signal, and wherein a drain of the first transistor and a source of the second transistor are connected to each other and supply adiabatic voltage signals to the first and fourth pair of transistors of the CC circuit;
   a third transistor, a drain of the third transistor is connected to the drain of the first transistor and the source of the second transistor; and
   a fourth transistor, a source of the fourth transistor is connected to the drain of the first transistor and the source of the second transistor.

10. A capacitively-coupled static random access memory (SRAM-C) compute-in-memory (CIM) circuit, comprising:
   at least one static random access memory (SRAM) configured to store a bit value; and
   at least one capacitively-coupled (CC) circuit coupled to the at least one SRAM, comprising:

a first transistor, a second transistor, a third transistor, and a fourth transistor that are first type transistors; and a fifth transistor, a sixth transistor, a seventh transistor, and an eighth transistor that are second type transistors, wherein a source of the first transistor is connected to a source of the fifth transistor, a source of the second transistor is connected to a source of the sixth transistor, a source of the third transistor is connected to a source of the seventh transistor, and a source of the fourth transistor is connected to a source of the eighth transistor, and wherein a drain of the first transistor is connected to a drain of the fifth transistor, a drain of the second transistor is connected to a drain of the sixth transistor, a drain of the third transistor is connected to a drain of the seventh transistor, and a drain of the fourth transistor is connected to a drain of the eighth transistor;

a first capacitor, wherein a first terminal of the first capacitor is connected to the sources of the first and fifth transistors and is connected to the drains of the second and sixth transistors; and a second capacitor, wherein a first terminal of the second capacitor is connected to the sources of the third and seventh transistors and is connected to the drains of the fourth and eighth transistors.

11. The SRAM-C CIM circuit of claim 10 wherein the first type transistor is a p-channel metal-oxide semiconductor (PMOS) transistor and the second type transistor is an n-channel metal-oxide semiconductor (NMOS) transistor.

12. The SRAM-C CIM circuit of claim 10, further comprising a successive-approximation-register (SAR) analog-to-digital converter (ADC) to perform multiply-and-accumulate (MAC) operations for the SRAM.

13. The SRAM-C CIM circuit of claim 10, further comprising an energy recovery logic (ERL) driver configured to recover signal energy by utilizing a ramped sinusoidal hot clock for charging/discharging of the CC circuit during a compute mode and for holding a voltage of the CC circuit during an idle mode, wherein the ERL driver supplies adiabatic voltage signals to the drains of the first and fifth transistors and to the drains of the third and seventh transistors of the CC circuit.

14. The SRAM-C CIM circuit of claim 13, wherein the ERL driver comprises:

a first transistor and a second transistor, wherein a source of the first transistor and a drain of the second transistor are connected to a hot clock to receive a clock signal, and wherein a drain of the first transistor and a source of the second transistor are connected to each other and supply adiabatic voltage signals to the drains of the first and fifth transistors and to the drains of the fourth and eighth transistors of the CC circuit;

a third transistor, a drain of the third transistor is connected to the drain of the first transistor and the source of the second transistor; and a fourth transistor, a source of the fourth transistor is connected to the drain of the first transistor and the source of the second transistor.

15. The SRAM-C CIM circuit of claim 10, wherein said at least one SRAM comprises:

a first transistor, a second transistor, a third transistor, a fourth transistor, a fifth transistor, and a sixth transistor, wherein the first and second transistors are the first type transistors and the third, fourth, fifth, and sixth transistors are the second type transistors, wherein:

gates of the first and third transistors, drains of the second and fourth transistors, and a source of the sixth transistor are connected to each other;

gates of the second and fourth transistors, drains of the first and third transistors, and a source of the fifth transistor are connected to each other;

a drain of the fifth transistor is connected to a complementary bit line to receive a complementary bit line signal;

a drain of the sixth transistor is connected to a bit line to receive a bit line signal; and gates of the fifth and sixth transistors are connected to a word line to receive a word line signal for read/write operations of the SRAM.

16. The SRAM-C CIM circuit of claim 15, wherein:

gates of the fifth and seventh transistors of the CC circuit are connected to the gates of the second and fourth transistors of the SRAM, the drains of the first and third transistors of the SRAM, and the source of the fifth transistor of the SRAM; and gates of the sixth and eighth transistors of the CC circuit are connected to the gates of the first and third transistors of the SRAM, the drains of the second and fourth transistors of the SRAM, and the source of the sixth transistor of the SRAM.

17. The SRAM-C CIM circuit of claim 15 further comprising a bit line driver for supplying the bit line signal and the complementary bit line signal to the SRAM.

18. The SRAM-C CIM circuit of claim 15 further comprising a word line driver for supplying the word line signal to the SRAM.

* * * * *